United States Patent
Hong et al.

(10) Patent No.: US 9,589,925 B2
(45) Date of Patent: Mar. 7, 2017

(54) METHOD FOR BONDING WITH A SILVER PASTE

(71) Applicant: HYUNDAI MOTOR COMPANY, Seoul (KR)

(72) Inventors: Kyoung-Kook Hong, Hwaseong-si (KR); Hyun Woo Noh, Seoul (KR); Youngkyun Jung, Seoul (KR); Dae Hwan Chun, Gwangmyeong-si (KR); Jong Seok Lee, Suwon-si (KR); Su Bin Kang, Busan (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 14/800,607

(22) Filed: Jul. 15, 2015

(65) Prior Publication Data
US 2016/0148900 A1 May 26, 2016

(30) Foreign Application Priority Data

Nov. 21, 2014 (KR) .................... 10-2014-0163762

(51) Int. Cl.
*B23K 1/00* (2006.01)
*B23K 1/19* (2006.01)
(Continued)

(52) U.S. Cl.
CPC .............. *H01L 24/83* (2013.01); *B23K 20/02* (2013.01); *B23K 35/025* (2013.01);
(Continued)

(58) Field of Classification Search
CPC  B23K 35/0244; B23K 35/025; B23K 35/264; H05K 3/3484; H05K 2201/0215;
(Continued)

(56) References Cited

U.S. PATENT DOCUMENTS

2013/0279118 A1* 10/2013 Koyama .................... C09J 9/00
361/709
2014/0126155 A1* 5/2014 Imamura ............ B23K 35/3006
361/715

FOREIGN PATENT DOCUMENTS

JP   WO 2013002407 A1 * 1/2013 ......... B23K 35/3006
KR        10-0976026 B1    8/2010
(Continued)

OTHER PUBLICATIONS

A. Sharif, et al., "Transient liquid phase Ag-based solder technology for high-temperature packaging applications," Journal of Alloys and Compounds, vol. 587, Feb. 25, 2014, pp. 365-368.
(Continued)

*Primary Examiner* — Erin Saad
(74) *Attorney, Agent, or Firm* — McDermott Will & Emery LLP

(57) ABSTRACT

Disclosed is a method for bonding with a silver paste, the method including: coating a silver paste on a semiconductor device or a substrate, the silver paste containing silver and indium; disposing the semiconductor on the substrate; and heating the silver paste to form a bonding layer, wherein the semiconductor device and the substrate are bonded to each other through the bonding layer, and wherein the indium is contained in the silver paste at 40 mole % or less.

5 Claims, 12 Drawing Sheets

(51) Int. Cl.
*H01L 23/00* (2006.01)
*B23K 35/02* (2006.01)
*B23K 35/30* (2006.01)
*B23K 20/02* (2006.01)

(52) U.S. Cl.
CPC .......... *B23K 35/3006* (2013.01); *H01L 24/27* (2013.01); *B23K 2203/08* (2013.01); *B23K 2203/18* (2013.01); *B23K 2203/52* (2015.10); *B23K 2203/56* (2015.10); *H01L 2224/2741* (2013.01); *H01L 2224/27848* (2013.01); *H01L 2224/29109* (2013.01); *H01L 2224/29139* (2013.01); *H01L 2224/32225* (2013.01); *H01L 2224/832* (2013.01); *H01L 2224/83825* (2013.01)

(58) Field of Classification Search
CPC ... H05K 2201/0218; H05K 2201/0272; H05K 3/3463; B22F 1/0003; B22F 1/0059; B22F 1/025

USPC .............. 228/262.9, 101, 193, 248.1; 148/24
See application file for complete search history.

(56) References Cited

FOREIGN PATENT DOCUMENTS

| KR | 10-2010-0118524 A | 11/2010 |
| KR | 10-2014-0091090 A | 7/2014 |
| KR | 10-2014-0119248 A | 10/2014 |

OTHER PUBLICATIONS

A. Bajwa, et al., "Foil Based Transient Liquid Phase Bonding as a Die-Attachment Method for High Temperature Devices," Conferences on integrated power electronic systems (CIPS) Feb. 25-27, 2014.

* cited by examiner

METHOD FOR BONDING WITH A SILVER PASTE

CROSS-REFERENCE TO RELATED APPLICATION

This application claims priority to and the benefit of Korean Patent Application No. 10-2014-0163762 filed in the Korean Intellectual Property Office on Nov. 21, 2014, the entire contents of which are incorporated herein by reference.

BACKGROUND OF THE INVENTION (a) Field of the Invention

The present invention relates to a method of bonding with a silver paste. More specifically, the present invention relates to a method of bonding with a silver paste to bond a semiconductor device.

(b) Description of the Related Art

Following the recent trend of appliances becoming larger and having a larger capacity, the need for power semiconductor devices having a high breakdown voltage with a high current and high-speed switching is increasing. Of these, silicon carbide (SiC) semiconductor devices have a wider band gap than existing silicon (Si) semiconductor devices, and thus implement stable semiconductor characteristics even at a high temperature.

However, it is necessary to apply stable packaging materials even at a high temperature in order to obtain the effect of high-temperature operation. Particularly, current solder used to bond semiconductor devices has a melting point of lower than 230□, and thus cannot be utilized at a bonding temperature of 250□ at which silicon carbide semiconductor devices are eventually operated.

In order to replace the current solder, high-temperature solder or the like containing gold (Au) has recently been suggested as an alternative. However, the high-temperature solder or the like is expensive and has inferior properties such as joining strength.

In addition, a method of sintering and joining silver (Ag) nano-particles has been suggested as a method for high-temperature bonding, but a long process at a high temperature is needed, resulting in deterioration in device characteristics. A paste containing a mediator material such as glass frit has been formed to activate sintering between large-sized silver particles, but residual glass may cause an increase in resistance.

The above information disclosed in this Background section is only for enhancement of understanding of the background of the invention and therefore it may contain information that does not form the prior art that is already known in this country to a person of ordinary skill in the art. addition, the joining is conducted using the silver paste which contains the silver particles and includes the core parts made of plate-shaped silver and the coating parts coated on surfaces of the core parts and made of indium, thereby minimizing the void distribution in the bonding layer.

DETAILED DESCRIPTION OF THE EMBODIMENTS

Figure 1:
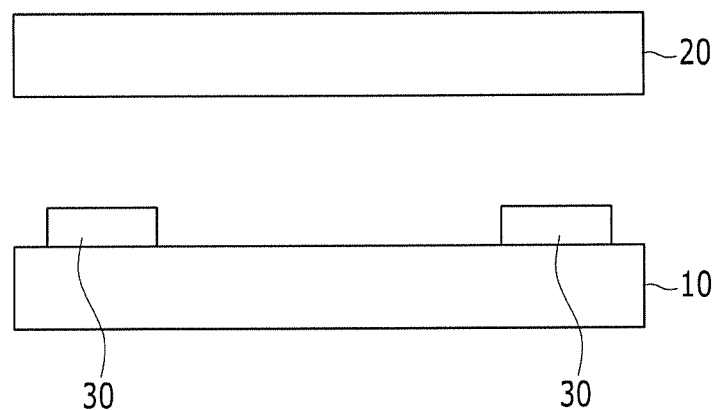
FIGS. 1 and 2 are views schematically showing a process of bonding a semiconductor device to a substrate using a silver paste.

Exemplary embodiments of the present invention will be described in detail with reference to the accompanying drawings. However, the present invention is not limited to the embodiments described herein, and thus may be embodied in many different forms. Rather, these embodiments are provided so that this disclosure will be thorough and complete, and will fully convey the scope of the invention to those skilled in the art.

In the drawings, the thickness of layers, films, panels, regions, etc., are exaggerated for clarity. Further, it will be understood that when a layer is referred to as being "on" another layer or a substrate, it may be formed directly on another layer or the substrate or a third layer may be interposed therebetween. Throughout the specification, like numerals substantially refer to like components.

Now, a method for bonding with a silver paste according to an exemplary embodiment of the present invention will be described with reference to FIGS. 1 to 8.

Figure 2:
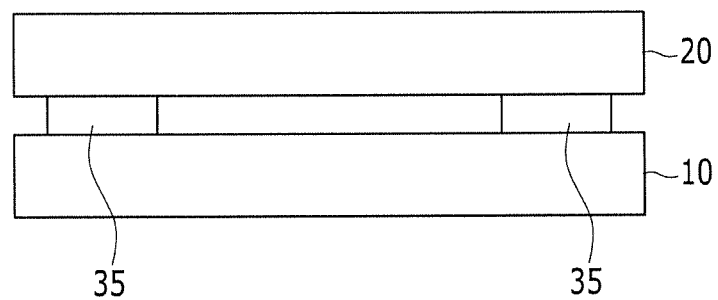

FIGS. 1 and 2 are views schematically showing a process of bonding a semiconductor device to a substrate using a silver paste according to an exemplary embodiment of the present invention.

Referring to FIGS. 1 and 2, after a silver paste 30 is coated on a substrate 10, a silicon carbide (SiC) semiconductor device 20 is disposed on the substrate 10 coated with the silver paste 30, and then the silver paste 30 is heated and sintered to form a bonding layer 35. Hence, the semiconductor device 20 and the substrate 10 are bonded to each other through the bonding layer 35. The silver paste 30 is coated on the substrate 10 in the present exemplary embodiment, but the present invention is not limited thereto. For example, the silver paste 30 may be coated on the semiconductor device 20 before the silver paste 30 is heated and sintered.

Hereinafter, a silver paste and a method for bonding with a silver paste according to an exemplary embodiment of the present invention will be described in detail.

Figure 3:
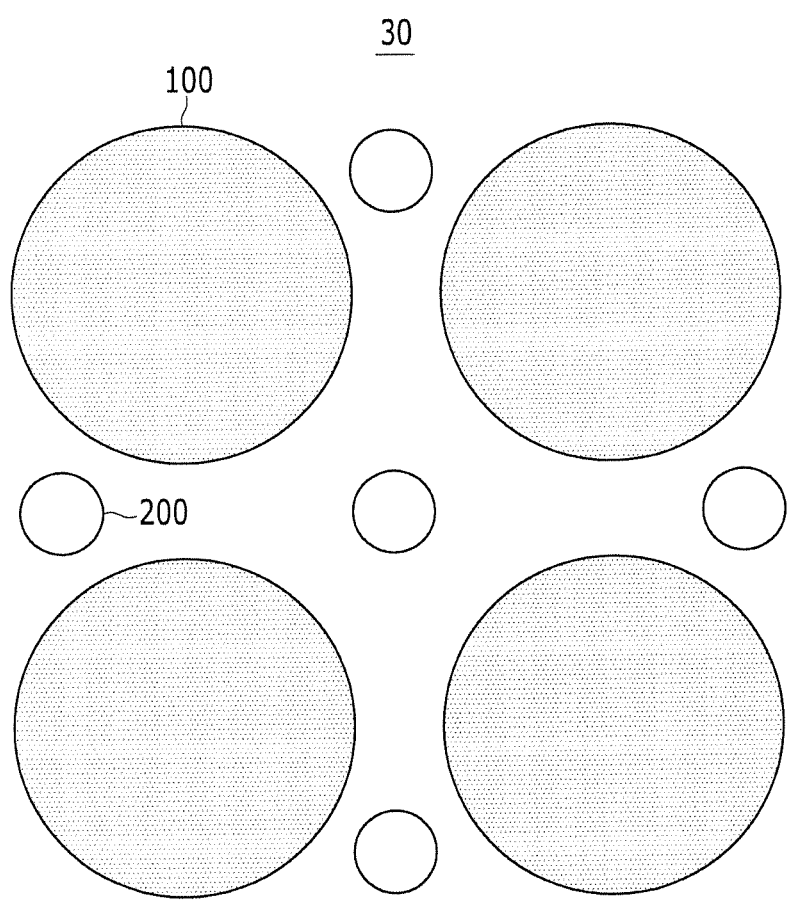
FIG. 3 is a view schematically showing a silver paste according to an exemplary embodiment of the present invention.

FIG. 3 is a view schematically showing a silver paste according to an exemplary embodiment of the present invention.

Referring to FIG. 3, a silver paste 30 according to the present exemplary embodiment contains a plurality of silver particles 100 and a plurality of indium (In) particles. The silver particles 100 and the indium particles 200 may each have a spherical shape and a diameter of 1 μm to 10 μm.

The indium particles 200 are contained in the silver paste 30 at 40 mole % or less. Preferably, the indium particles 200 are contained in the silver paste 30 at 20 mole % or less. Here, when the indium particles 200 are contained in the silver paste 200 at more than 40 mole %, at the time of sintering the silver paste 30, the heating temperature may increase or the indium ingredient may remain on the bonding layer 35, causing bonding to be difficult.

Figure 4:
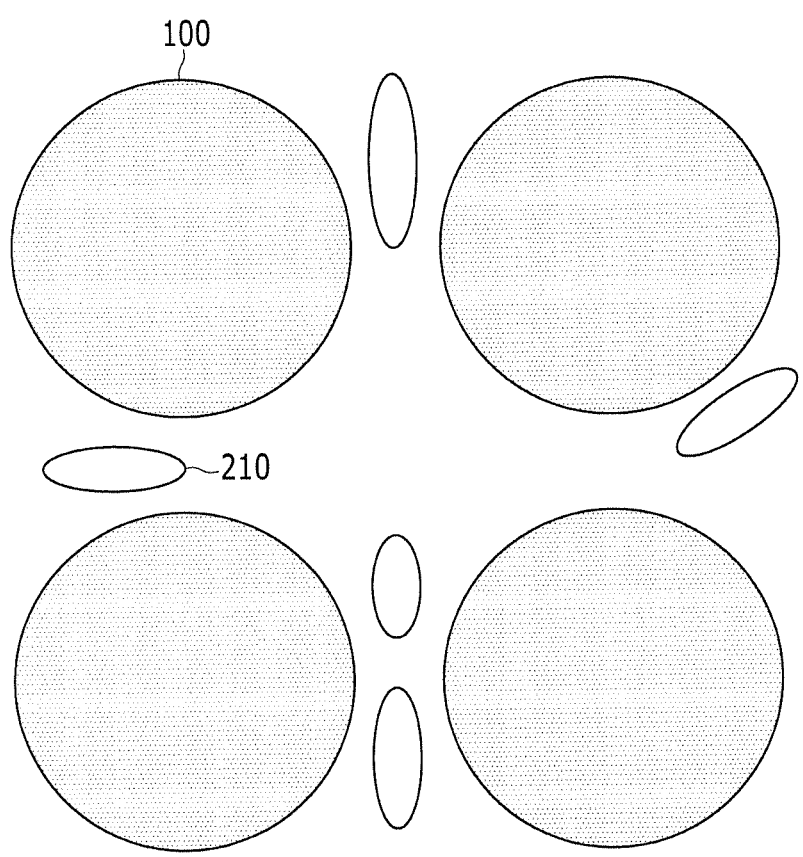
FIGS. 4 to 8 are views sequentially showing a method for bonding with a silver paste according to an exemplary embodiment of the present invention.

FIGS. 4 to 8 are views sequentially showing a method for bonding with a silver paste according to an exemplary embodiment of the present invention. Referring to FIG. 4, the silver paste 30 containing the plurality of silver particles 100 and the plurality of indium particles 200 is heated. The heating is conducted at a temperature of 160☐ or higher. Preferably, the heating is conducted at 300☐. In cases where the heating temperature is higher than the melting point of indium, approximately 157☐, the indium particles 200 melt into indium liquids 210. Since the melting point of silver is approximately 962☐, the silver particles 100 maintain the particle state even though they are heated to 300☐. In addition, a chemical reaction does not occur between the indium liquid 210 and the silver particles 100.

Figure 5:
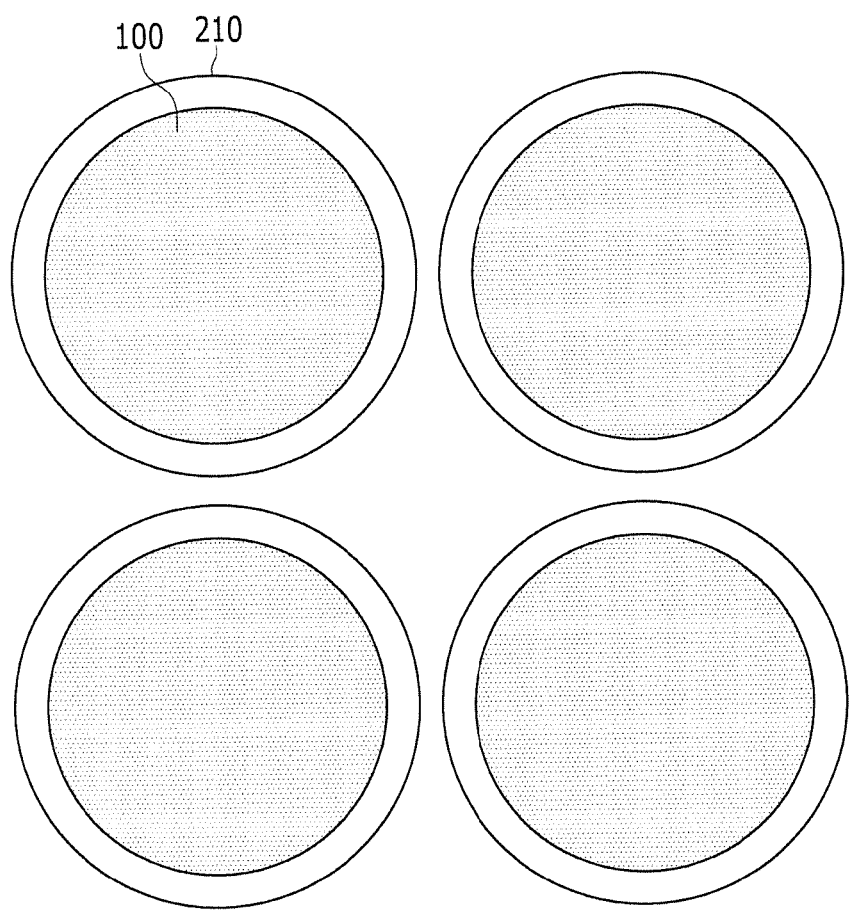
Figure 6:
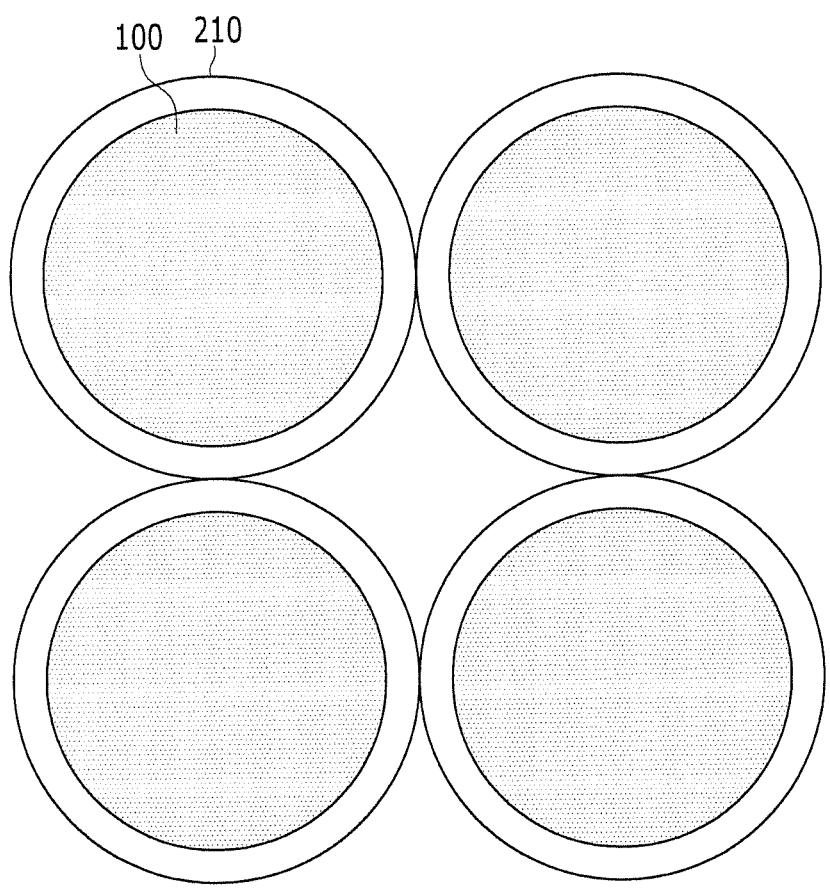

Referring to FIGS. 5 and 6, the indium liquid 210 is in a wetting state on a surface of each of the silver particles 100, and thus the indium liquid 210 covers the surface of each of the silver particles 100. The term "wetting state" refers to a change of a solid-gas interface into a solid-liquid interface since a gas contacting a surface of a solid is pushed out by a liquid.

Then, the indium liquid 210 covering the surface of the silver particles 100 is in contact with the neighboring indium liquid 210, and thus the indium liquids 210 covering the respective silver particles 100 are in contact with each other.

Figure 7:
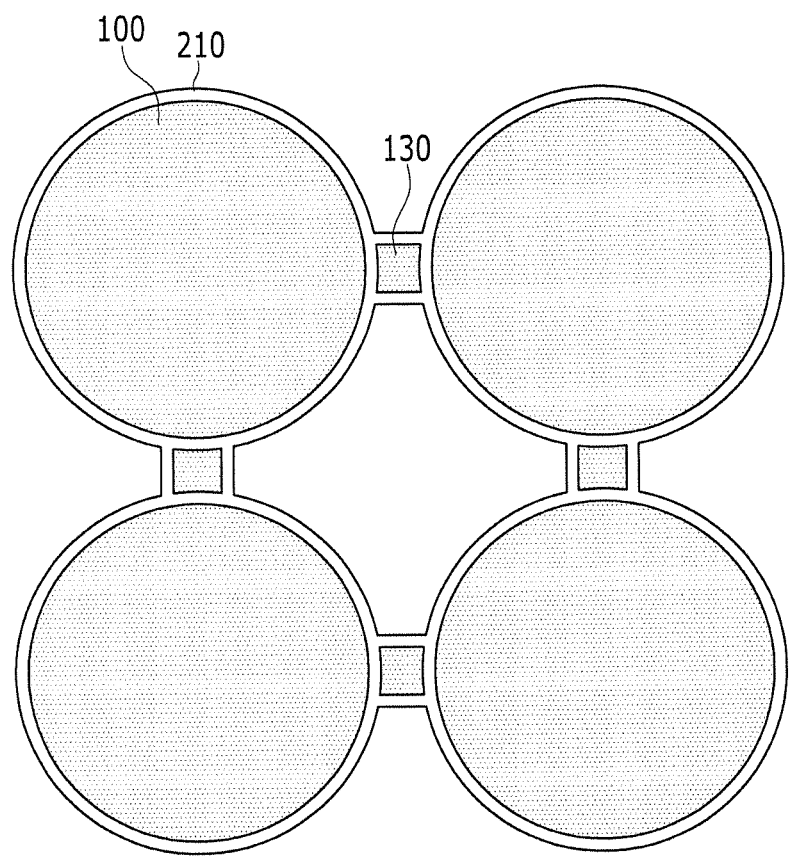

Referring to FIG. 7, the indium liquids 210 covering the silver particles 100 gradually diffuse into the silver particles 100 through the contact between the indium liquid 210 and the indium liquid 210. Thus, the amount of indium liquid 210 covering the silver particles 100 decreases. In addition, the silver particles 100 diffuse into the indium liquid 210, which are in contact, to form a bonding region 130 in which the respective silver particles are joined to each other.

Figure 8:
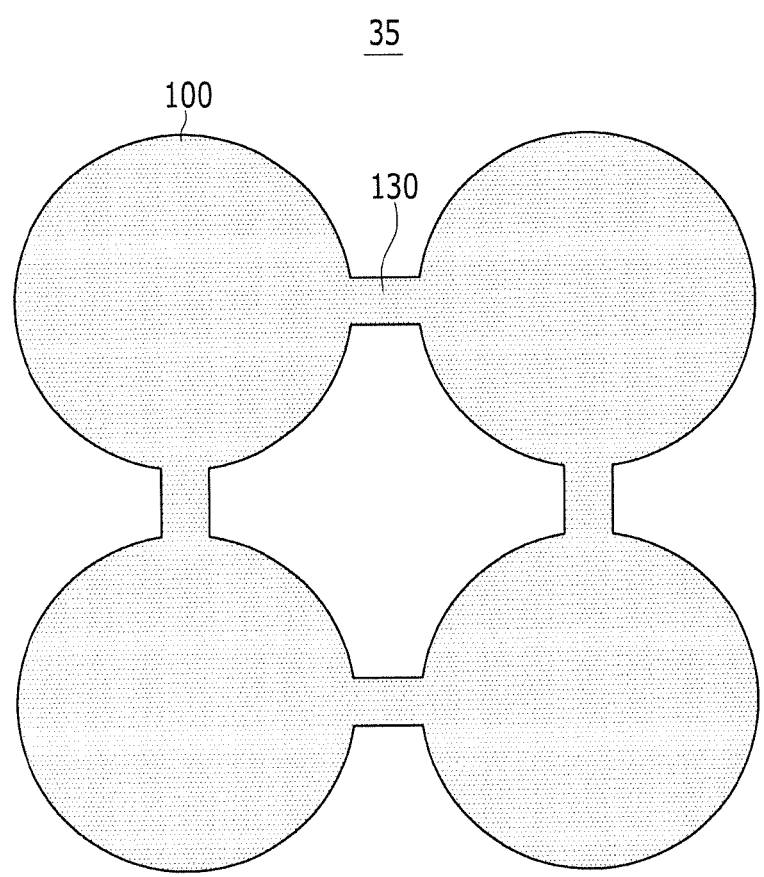

Referring to FIG. 8, all the indium liquid 210 covering the silver particles 100 diffuses into the silver particles 100, and hence disappear. Thus, the respective silver particles 100 are joined to each other by the bonding region 130 to form the bonding layer 35. Therefore, the silver paste 30 according to FIG. 1 forms the bonding layer 35, and the semiconductor device 20 is bonded to the substrate 10 through the bonding layer 35.

This bonding method is called a transient liquid phase diffusion bonding method.

According to the transient liquid phase diffusion bonding method, in order to bond same metals A to each other, a metal B having a lower melting point than a metal A is positioned between metals A and then heating is conducted at a temperature higher than the melting point of the metal B, so that the metal B is liquefied to diffuse in the solid phase metal A. Therefore, the metal B disappears, and the solid phase metals A are joined to each other.

In the present exemplary embodiment, silver materials are joined to each other by using indium, which is a metal material having a lower melting point than silver. In other words, since the melting point of silver is sufficiently higher than that of indium, the silver particles 100 are used for joining, and the indium particles 200 are an activating material for joining of the silver particles 100.

As such, at the time of bonding with the silver paste 30, the diffusion of the indium liquid 210 into the silver particles 100 and the diffusion of the silver particles into the indium liquid 210 are simultaneously conducted, thereby shortening the bonding time.

Meanwhile, the existing bonding with the silver paste is achieved by sintering, and the sintering temperature and the sintering time depend on the size of the silver particles. However, in the present exemplary embodiment, the silver particles can be bonded to each other merely by heating the silver paste at only the melting point of indium or higher without melting the silver particles, thereby making it possible to use relatively large-sized silver particles. In addition, at the time of heating for sintering, heating is conducted at only the melting point of indium or higher, thereby shortening the sintering time and thus reducing the time when a semiconductor device is exposed to high temperature, so that damage to the semiconductor device can be minimized at the time of bonding.

Further, an existing silver paste contains a sintering mediator material such as glass frit, but this sintering mediator material is not a metal material, causing the increase in electrical resistance. However, in the present exemplary embodiment, the indium particles are used as an activating material for joining the silver particles without using the sintering mediator material, thereby reducing the electrical resistance.

Hereinafter, a silver paste and a method for bonding with a silver paste according to another exemplary embodiment of the present invention will be described with reference to FIGS. 9 to 12.

Figure 9:
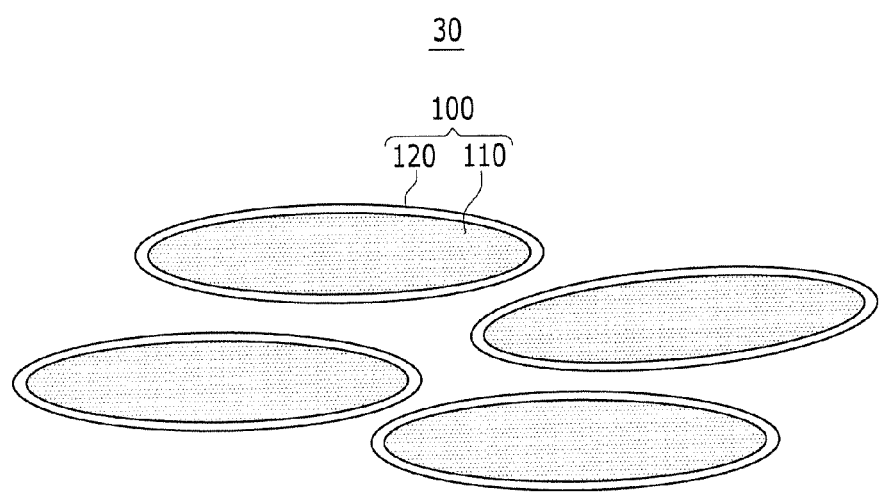
FIG. 9 is a view schematically showing a silver paste according to another exemplary embodiment of the present invention.

FIG. 9 is a view schematically showing a silver paste according to another exemplary embodiment of the present invention.

Referring to FIG. 9, a silver paste 30 according to the present exemplary embodiment contains a plurality of silver particles 100. Each of the silver particles 100 includes a core part 110 made of plate-shaped silver and a coating part 120 coated on a surface of the core part and made of indium. The size of the core part 110 may be 1 μm to 10 μm.

Indium constituting the coating part 120 is contained in each of the silver particles 100 at 40 mole % or less. Preferably, indium is contained in each of the silver particles 100 at 20 mole % or less. Here, when indium is contained in each of the silver particles 100 at more than 40 mole %, at the time of sintering the silver paste, the heating temperature may increase or the indium component may remain on the bonding layer 35, causing bonding to be difficult.

Figure 10:
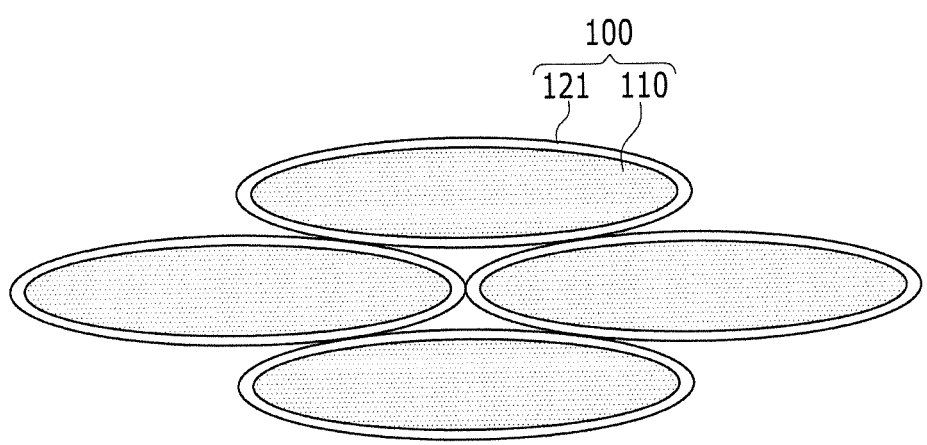
FIGS. 10 to 12 are views sequentially showing a method for bonding with a silver paste according to another exemplary embodiment of the present invention.
Figure 11:
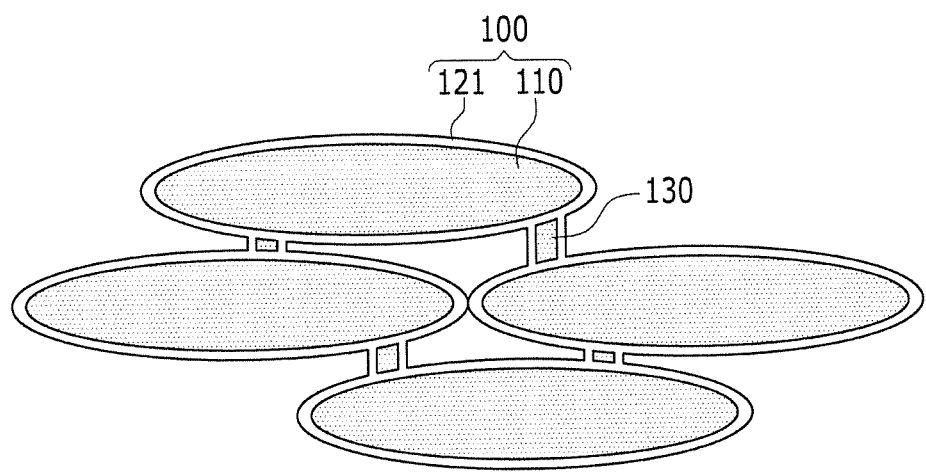
Figure 12:
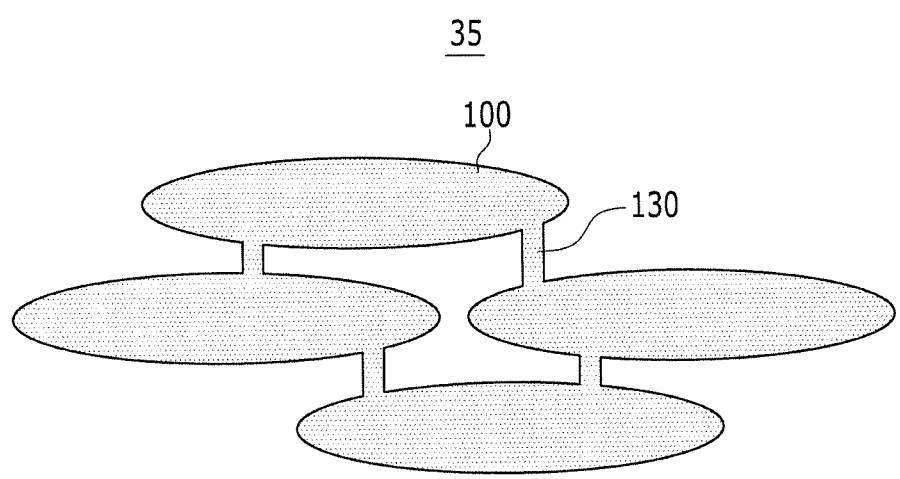

FIGS. 10 to 12 are views sequentially showing a method for bonding with a silver paste according to another exemplary embodiment of the present invention.

Referring to FIG. 10, a silver paste 30 containing a plurality of silver particles 100 is heated. The heating is conducted at a temperature of 160☐ or higher. Preferably, the heating is conducted at 300☐. In cases where the heating temperature is higher than the melting point of indium, approximately 157☐, the indium constituting the coating part 120 melts to form a liquid coating part 121. The liquid coating part 121 contains an indium liquid. Since the melting point of silver is approximately 962☐, the silver particles constituting the core part 110 maintain their particle state even though the silver particles 100 are heated to 300☐. In addition, a chemical reaction does not occur between the indium liquid and the silver particles.

Here, the liquid coating part 121 is in a wetting state on a surface of each coating part 110, and thus covers the surface of each core part 110.

Then, the liquid coating part 121 covering the surface of each coating part 110 is in contact with an adjacent liquid coating part 121, and thus the liquid coating parts 121 covering the respective core parts 110 contact each other.

Referring to FIG. 11, the indium liquid constituting the liquid coating parts 121 which cover the core part 110 gradually diffuse into the core parts 110 through the contact between the adjacent liquid coating parts 121. Thus, the amount of the liquid coating parts 212 is reduced. In addition, the silver constituting the core parts 110 diffuses into the liquid coating parts 121 in contact with each other, thereby forming a bonding region 130 which joins the core parts 110 to each other.

Referring to FIG. 12, the indium liquid constituting the liquid coating parts 121 diffuse into the core parts 110 and hence disappear. Therefore, the respective core parts 110 are joined to each other by the bonding region 130 to form a bonding layer 35. Thus, the silver paste 30 according to FIG. 1 forms the bonding layer 35, and the semiconductor device 20 is bonded to the substrate 10 through the bonding layer 35.

Since the silver particles 100 can be joined by merely heating the silver particles 100 at only the melting point of indium or higher without melting the silver particles 100, the sintering time can be shortened, and thus the time while the semiconductor device is exposed to a high temperature can be reduced, thereby minimizing damage to the semiconductor device.

Further, since the indium is used as an activating material for joining the silver particles without using the sintering mediator material, the electrical resistance can be reduced.

In addition, since the core part 110 has a plate shape, the void distribution in the bonding region 35 can be minimized when the bonding layer 35 is formed.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| 30: | silver paste | 35: | bonding layer |
|---|---|---|---|
| 100: | silver particles | 110: | core part |
| 120: | coating part | 121: | liquid coating part |
| 130: | bonding region | 200: | indium particles |
| 210: | indium liquid | | |

What is claimed is:

1. A method for bonding with a silver paste, the method comprising steps of:
    coating the silver paste, which contains silver and indium, on a semiconductor device or a substrate;
    placing the semiconductor device on the substrate; and
    heating the silver paste to form a bonding layer,
    wherein the semiconductor device and the substrate are bonded to each other through the bonding layer,
    wherein the indium contained in the silver paste is 40 mole % or less,
    wherein each of the silver and the indium have a spherical particle shape and the silver paste contains a plurality of spherical silver particles and a plurality of spherical indium particles,
    wherein the step of forming the bonding layer comprises steps of:
    heating the silver paste to transform the spherical indium particles into an indium liquid;
    covering surfaces of the spherical silver particles with the indium liquid;
    contacting the indium liquid which covers the surfaces of the spherical silver particles with an adjacent indium liquid;
    diffusing the indium liquid into the spherical silver particles while also diffusing the spherical silver particles into the indium liquid to form a bonding region which joins the spherical silver particles to each other, and
    wherein, in the step of diffusing the indium liquid into the spherical silver particles, all of the indium liquid diffuses into the spherical silver particles.

2. The method of claim 1, wherein the indium is contained in the silver paste at 20 mole % or less.

3. The method of claim 2, wherein in the heating of the silver paste, the heating is conducted at 160° C. or higher.

4. The method of claim 3, wherein in the step of heating the silver paste, the heating is conducted at 300° C. or higher.

5. A method for bonding with a silver paste, the method comprising steps of:
    coating the silver paste, which contains silver and indium, on a semiconductor device or a substrate;
    placing the semiconductor device on the substrate; and
    heating the silver paste to form a bonding layer,
    wherein the semiconductor device and the substrate are bonded to each other through the bonding layer,
    wherein the indium contained in the silver paste is 40 mole % or less,
    wherein the silver paste includes a plurality of plate-shaped core parts of which surfaces are coated with coating parts, the silver constituting the plate-shaped core parts, and the indium constituting the coating parts,
    wherein the step of forming the bonding layer comprises:
    heating the silver paste to transform the coating parts into liquid coating parts;
    contacting a liquid coating part of the liquid coating parts with an adjacent liquid coating part of the liquid coating parts;
    diffusing the indium of the liquid coating parts into the plate-shaped core parts while also diffusing the silver of the plate-shaped core parts into the liquid coating parts to form a bonding region which joins the plate-shaped core parts to each other, and
    wherein, in the step of diffusing the indium into the plate-shaped core parts, all of the indium diffuses into the plate-shaped core parts.

* * * * *